United States Patent
Ke et al.

(10) Patent No.: US 9,349,997 B2
(45) Date of Patent: May 24, 2016

(54) DISPLAY PANEL AND METHOD FOR FABRICATION THEREOF

(71) Applicant: Au Optronics Corporation, Hsinchu (TW)

(72) Inventors: Tsung-Ying Ke, Tainan (TW); Kuei-Ning Cheng, Taipei (TW); Chih-Chieh Lin, Changhua County (TW); Yung-Hsiang Lan, New Taipei (TW); Yen-Huei Lai, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/983,567

(22) Filed: Dec. 30, 2015

(65) Prior Publication Data

US 2016/0111690 A1    Apr. 21, 2016

Related U.S. Application Data

(62) Division of application No. 14/312,709, filed on Jun. 24, 2014, now Pat. No. 9,257,669.

(30) Foreign Application Priority Data

Jan. 24, 2014    (TW) .............................. 103102702 A

(51) Int. Cl.
*H01L 51/56* (2006.01)
*H01L 27/12* (2006.01)
*H01L 51/52* (2006.01)

(52) U.S. Cl.
CPC ............ *H01L 51/56* (2013.01); *H01L 27/1259* (2013.01); *H01L 51/5246* (2013.01); *H01L 2227/323* (2013.01); *H01L 2227/326* (2013.01)

(58) Field of Classification Search
CPC . H01L 51/56; H01L 27/1259; H01L 51/5246; H01L 2227/326; H01L 2227/323
See application file for complete search history.

(56) References Cited

FOREIGN PATENT DOCUMENTS

CN    203134796    8/2013

*Primary Examiner* — Donald Raleigh
*Assistant Examiner* — Kevin Quarterman
(74) *Attorney, Agent, or Firm* — Jianq Chyun IP Office

(57) ABSTRACT

A display panel is provided. The display panel includes a substrate, a pixel array, a peripheral circuit, and a protective layer. The substrate includes a display region and a non-display region. The pixel array is located in the display region of the substrate. The peripheral circuit is located in the non-display region. The protective layer is located in the display region and the non-display region. The peripheral circuit and the pixel array are covered by the protective layer. The protective layer in the non-display region has a plurality of openings, which expose the substrate. The apertures of the openings is between 1 μm and 1 mm, and the spacing between the openings is 10 μm and 1 cm.

6 Claims, 5 Drawing Sheets

DISPLAY PANEL AND METHOD FOR FABRICATION THEREOF

CROSS-REFERENCE TO RELATED APPLICATION

This application is a divisional application of and claims the priority benefit of U.S. application Ser. No. 14/312,709, filed on Jun. 24, 2014, now allowed. The prior application Ser. No. 14/312,709 claims the priority benefit of Taiwan application serial no. 103102702, filed on Jan. 24, 2014. The entirety of each of the above-mentioned patent applications is hereby incorporated by reference herein and made a part of this specification.

BACKGROUND OF THE INVENTION

1. Field of the Invention

The invention relates to a display panel and a method for fabrication thereof, and more particularly, to a flexible display panel and a method for fabrication thereof.

2. Description of Related Art

With the rapid advance of the display technology, the display has been gradually developed from the early cathode ray tube (CRT) display to the current flat panel display (FPD). Comparing to the FPD composed by a hard carrier plate (such as a glass substrate), the FPD composed of a flexible substrate (such as a plastic substrate) has properties such as flexibility and impact resistance. Accordingly, flexible displays of which active devices are fabricated on the flexible substrates have been investigated in recent years.

In general, fabrication methods of the flexible display panels are to first fix the flexible substrate on the glass substrate through a releasing interface. Then, fabrication procedures of the display device are performed on the flexible substrate. After the fabrication of the display device is completed, adhesion force between the releasing interface and the flexible substrate is weakened through an irradiation of ultraviolet (UV) light from the backside of the glass substrate or a heat treatment, whereby the flexible substrate is removed from the glass substrate. However, if IC bonding is already completed before removing the flexible substrate, then the hard IC may lead to stress concentration and thus release force may be increased. Accordingly, the film on the flexible substrate may possibly be damaged in the process of removing the flexible substrate.

SUMMARY OF THE INVENTION

The invention provides a display panel and a fabrication method thereof, which may reduce the release force produced upon removing a flexible substrate, and thus a success rate of removing the flexible substrate may be further enhanced.

The invention provides a display panel. The display panel includes a substrate, a pixel array, a peripheral circuit, and a protective layer. The substrate includes a display region and a non-display region. The pixel array is located in the display region of the substrate. The peripheral circuit is located in the non-display region. The protective layer is located in the display region and the non-display region, and the peripheral circuit and the pixel array are covered by the protective layer. The protective layer in the non-display region has a plurality of openings to expose the substrate, wherein the aperture of the openings is between 1 μm and 1 mm, and the spacing between the openings is between 10 μm and 1 cm.

The invention further provides a fabrication method of the display panel. The fabrication method includes following steps. First, the sealing material layer and the substrate are sequentially formed on the supporting substrate, wherein the substrate has the display region and the non-display region. Then, the pixel array is formed in the display region of the substrate and the peripheral circuit is formed in the non-display region of the substrate, wherein the peripheral circuit and the pixel array are electrically connected. Then, the protective layer is formed on the substrate to cover the peripheral circuit and the pixel array. Next, the plurality of openings are formed in the protective layer of the non-display region to expose the substrate. Then, a gas is introduced and a treatment procedure is performed to the sealing material layer to reduce adhesion between the sealing material layer and the substrate, wherein the gas is introduced into the substrate through the openings and diffuses to the sealing material layer. Finally, the substrate and the sealing material layer are separated.

According to the above, in the display panel of the invention, the protective layer of the non-display region has the plurality of openings, which may greatly reduce the release force produced upon removing the flexible substrate, and thus the success rate of removing the flexible substrate may be enhanced. Accordingly, product yield of the display panel may be further improved.

In order to make the aforementioned and other features and advantages of the invention comprehensible, embodiments accompanied with figures are described in detail below.

DESCRIPTION OF EMBODIMENTS

Figure 1:
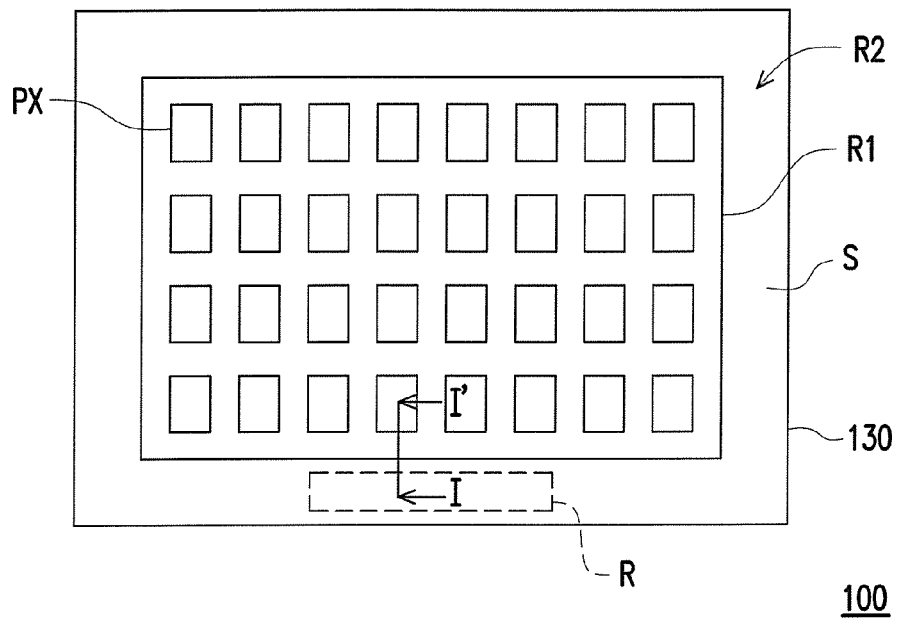
FIG. 1 illustrates a schematic top view of a display panel according to an embodiment of the invention.
Figure 2:
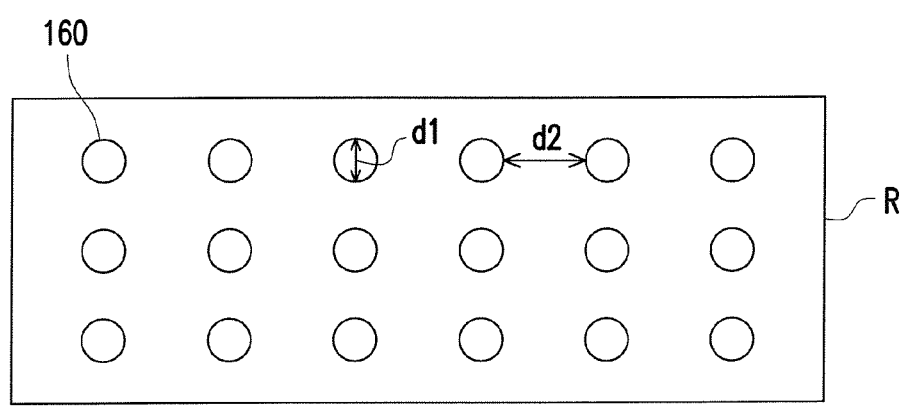
FIG. 2 illustrates a schematic enlarged view of an R region in the display panel of FIG. 1.

FIG. 1 illustrates a schematic top view of a display panel according to an embodiment of the invention. FIG. 2 illustrates a schematic enlarged view of an R region in the display panel of FIG. 1. Please refer to FIG. 1 and FIG. 2 simultaneously. In the present embodiment, a substrate 130 of a display panel 100 includes a display region R1 and a non-display region R2. Images are displayed in the display region R1 of the display panel 100, so that devices (such as pixel structures PX and display medium) for displaying images in the display panel are disposed in the display region R1. As shown in FIG. 1, the pixel structures PX form a pixel array in the display region R1. In contrast, the non-display region R2 does not display images, so that a peripheral circuit S and a driving chip region R are generally formed in the non-display region R2, in order to avoid affecting the appearance of the display panel 100. The peripheral circuit S and the pixel structure PX are electrically connected. The driving chip region R may include a chip IC to drive the display panel 100. In the present embodiment, the display region R1 is a rectangular region, and the non-display region R2 is a "☐"-shaped region which surrounds and adjacent to the display region R1. In other embodiments of the invention, the shape of the display region R1 may also be circular, elliptical, polygonal or other shapes, and the shape of the non-display region R2 may also be suitably changed according to the shape of the display region R1, but the invention is not limited thereto. Furthermore, the driving chip region R of the present embodiment is the rectangular region which is located at one side of the non-display region R2. However, the driving chip region R of other embodiments may also be located in another side of the non-display region R2, or even be disposed at the surrounding of the display region R1.

The display panel 100 of the present embodiment is such as a liquid crystal display (LCD) panel or an organic light emitting diode (OLED) panel using, for example, amorphous silicon, oxide semiconductor or low-temperature polysilicon (LTPS), as an active layer within a thin film transistor, but the type of the display panel is not limited by the invention. The pixel structure PX may have a different structure according to the type of the display panel 100. For example, an active device may be the thin film transistor, and a display device may be an electro-phoretic display (EPD) device or an OLED display device, etc. In addition, in the known structure of the display, the pixel structure PX may further include components such as a scan line, a data line, a pixel electrode, etc. The fabrication of the above pixel structure PX is through procedures such as coating, deposition, etching, and high-temperature treatment. The substrate 130 may include organic material such as polyimide (PI).

The display region R1 and the non-display region R2 in the display panel 100 of the present embodiment may have a protective layer (not shown). The peripheral circuit S and the pixel array formed by the pixel structure PX are covered by the protective layer. It should be noted that, the protective layer of the non-display region R2 may have a plurality of openings 160 (as shown in FIG. 2). The substrate 130 is exposed by the openings 160, that is, the openings 160 do not pass through the substrate 130. Specifically, the openings 160 of the present embodiment are formed in the driving chip region R of the non-display region R2, but the invention is not limited thereto, the openings 160 may also be formed in other regions of the non-display region R2. An aperture d1 of the openings 160 is, for example, between 1 µm and 1 mm. A spacing d2 between the openings 160 is, for example, between 10 µm and 1 cm, but the invention is not limited thereto. Depending on properties of the film on the substrate 130, the aperture d1 and the spacing d2 of the openings 160 in the non-display region R2 may be adjusted. For example, when the film on the substrate 130 has a shrinking stress, due to the fact that gas is not easy to laterally diffuse within the substrate 130, it is necessary that the aperture d1 of the openings 160 be increased or the spacing d2 of the openings 160 be reduced, in order to enhance an amount of the gas which passes through the openings 160 and reaches the sealing material layer (not shown) under the substrate 130. On the contrary, when the film on the substrate 130 has a tensile stress, the aperture d1 of the openings 160 may be reduced or the spacing d2 of the openings 160 may be increased. That is, a distribution density of the openings 160 in the non-display region R2 may be reduced, so that the design and the fabrication processes of the display panel 100 may become more easily. When the tensile stress of the upper film is increased by, for example, coating a layer of organic dielectric material which may bring additional tensile stress, it is observable that a laterally diffuse distance of the gas in the substrate 130 is increased. Furthermore, as shown in FIG. 2, the openings 160 of the present embodiment are evenly distributed, but the invention is not limited thereto. The distribution form of the openings 160 may be adjusted according to the need of the fabrication processes, as long as the openings 160 do not overlap with metal devices (such as wires and thin film transistors) in the non-display region R2.

Figure 3:
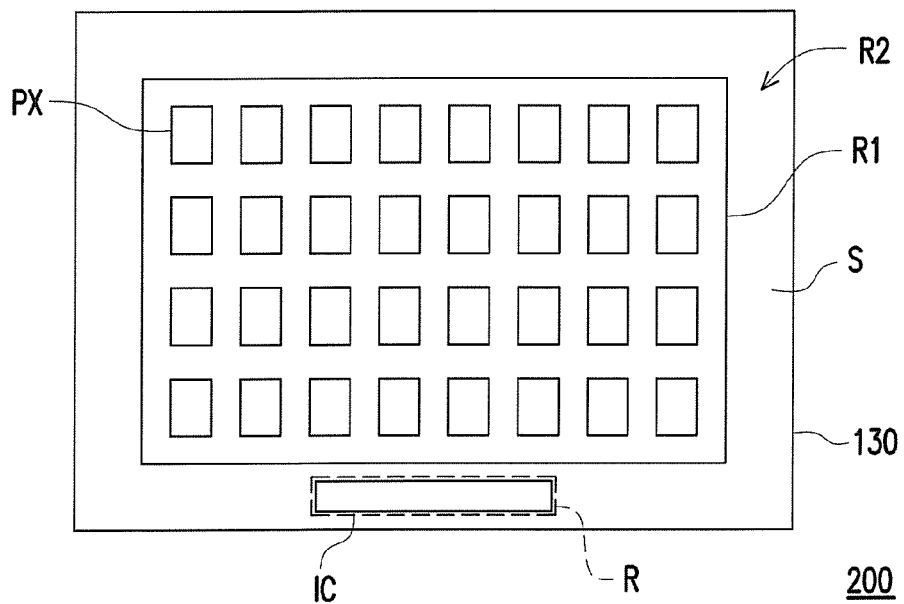
FIG. 3 illustrates a schematic top view of a display panel according to another embodiment of the invention.

FIG. 3 illustrates a schematic top view of a display panel according to another embodiment of the invention. The present embodiment is similar to the embodiment of FIG. 1, so that the same or similar devices are represented by the same or similar reference numerals and are not repeated herein. The difference between the display panel 200 and the display panel 100 is that the driving chip region R of the display panel 200 is already bonded to the chip IC. As illustrated above, in general, the release force is increased by the hard chip IC which leads to stress concentration if the chip IC is already bonded before removing the substrate 130, so that the film on the substrate 130 may be damaged in the process of removing the substrate 130. It is worth mentioning that, the protective layer (not shown) of the non-display region R2 in the display panel 200 of the present embodiment may have the plurality of openings 160 (as shown in FIG. 2). The substrate 130 is exposed by the openings 160, that is, the openings 160 do not pass through the substrate 130. By disposing the plurality of openings 160 in the non-display region R2, the gas may diffuse to the substrate 130 through the openings 160. In addition, the gas may further diffuse to the sealing material layer (not shown) under the substrate 130 due to the fact that the material of the substrate 130 (such as polyimide (PI)) does not have a gas-blocking property. The substrate 130 and the sealing material layer are separated by combining the gas and the subsequent treatments such as UV or the heat treatment. Based on the above, in the display panel 200 according to an embodiment of the invention, the non-display region R2 has the plurality of openings 160, which may greatly reduce the release force resulting from the bonding of the chip IC upon removing the substrate 130. Accordingly, product yield of the display panel 200 may be further improved. Specifically, in a case that the display panel 200 is an OLED panel, a water-blocking and the gas-blocking properties of the OLED region are also not destroyed due to the fact that the openings 160 are located in the non-display region R2. Hereinafter, the fabrication process steps of the display panel 100 are illustrated in more detail with reference to the figures.

FIG. 4A to FIG. 4I are cross-sectional views along a line I-I' in the display panel of FIG. 1 illustrating fabrication processes of a display panel according to an embodiment of the invention. First, please refer to FIG. 4A, a sealing material layer 120 is formed on the supporting substrate 110. The supporting substrate 110 is a substrate material which has translucency and can provide sufficient support strength such as a glass substrate. The sealing material layer 120 is such as an UV-sensitive organic material or an organic material which is sensitive to a specific band of light, wherein the materials thereof include parylene or photoresist materials. The parylene may be N-type, C-type, D-type, or HT-type parylene. The photoresist materials may be a positive photoresist or a negative photoresist. More specifically, the positive photoresist is, for example, a phenol formaldehyde resin, a polymethylmethacrylate (PMMA or acrylic); the negative photoresist is, for example, an epoxy-base resin or an acrylic series. The supporting substrate 110 and the sealing material layer 120 have good temperature resistance, and adhesion between the supporting substrate 110 and the sealing material layer 120 may be enhanced by the subsequent high-temperature fabrication process (such as higher than 250° C.).

Figure 4A:
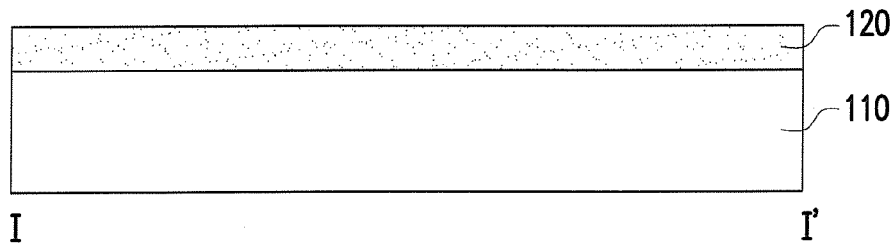
FIG. 4A to FIG. 4I are cross-sectional views along a line I-I' in the display panel of FIG. 1 illustrating fabrication processes of a display panel according to an embodiment of the invention.
Figure 4B:
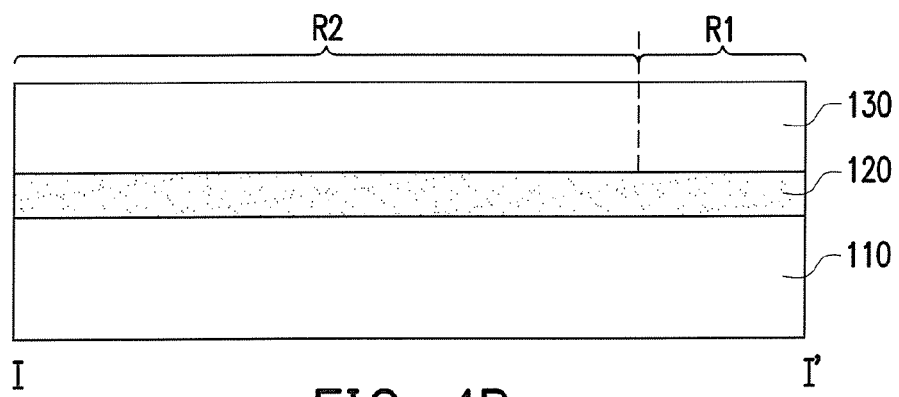

Then, please refer to FIG. 4B, the substrate 130 is formed on the sealing material layer 120, wherein the substrate 130 is fixed above the supporting substrate 110 through the sealing material layer 120. The substrate 130 has the display region R1 and the non-display region R2, wherein the non-display region R2 may further include the driving chip region R1. Herein, the substrate 130 may be firmly adhered to the supporting substrate 110 due to the fact that the adhesion between the supporting substrate 110 and the sealing material layer 120 may be enhanced by the subsequent high-temperature fabrication process. The material of the substrate 130 may include organic materials such as include polyimide (PI). Furthermore, a bottom surface of the substrate 130 is, for example, completely covered with the sealing material layer 120 of the present embodiment. That is, it is not necessary to perform a patterning process to the sealing material layer 120. Instead, the sealing material layer 120 is fully formed on the joint surface of the substrate 130.

Figure 4C:
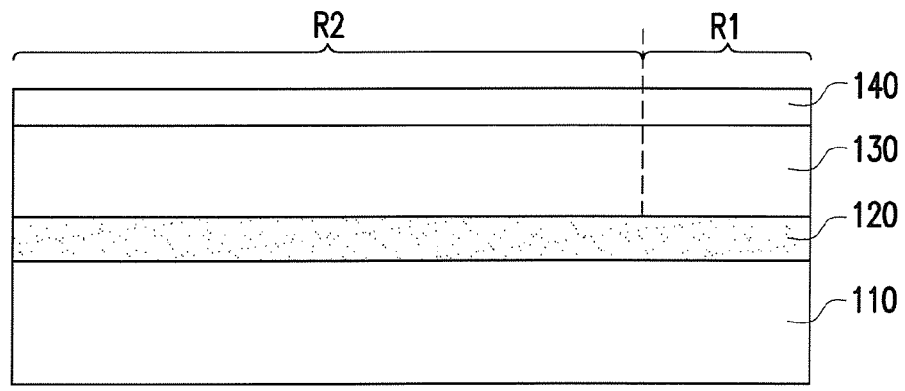

Next, as shown in FIG. 4C, a buffer layer 140 is formed on the substrate 130. The material of the buffer layer 140 includes an inorganic material (such as silicon oxide, silicon nitride, silicon oxynitride, other suitable materials, or a stacked layer of at least two materials above), organic materials, other suitable materials, or combinations thereof. In other embodiments, the step of forming the buffer layer 140 may be omitted.

Figure 4D:
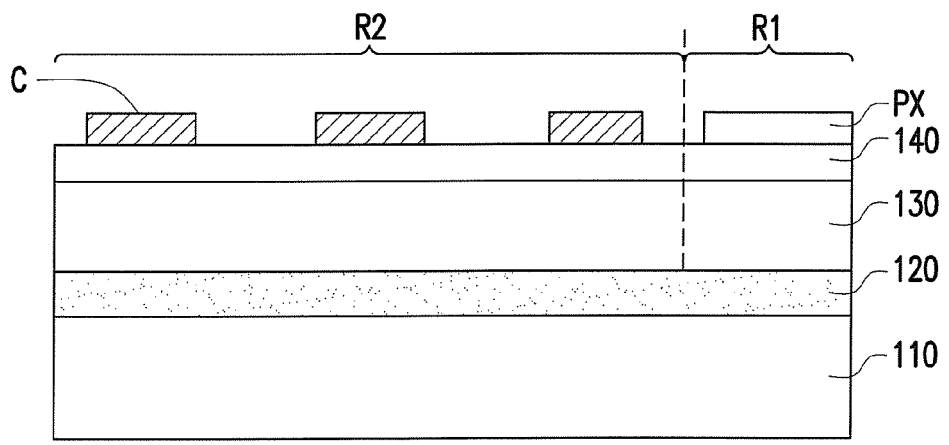

Then, as shown in FIG. 4D, the pixel array which is arranged by the plurality of pixel structures PX is formed in the display region R1 on the substrate 130. For illustration, only one pixel structure PX is illustrated herein. Specifically, the pixel structure PX may include the active device formed on the substrate 130 and a display device located on the active device. Herein, the pixel structure PX may have different structure according to the type of the display panel 100. For example, the active device may be the thin film transistor, and the display device may be the electro-phoretic display (EPD) device or the OLED display device. In addition, in the known structure of the display, the pixel structure PX may further include components such as scan lines, data lines, pixel electrodes, etc. The fabrication of the above pixel array is through procedures such as coating, deposition, etching, and high-temperature treatment. Furthermore, in the step, the peripheral circuit S is further formed in the non-display region R2 on the substrate 130. The peripheral circuit S is composed of a plurality of conductive devices C. The conductive devices C are, for example, metal wires, thin film transistors, or capacitors. The peripheral circuit S and the pixel array are electrically connected, to drive the pixel electrodes of the pixel structure PX.

Figure 4E:
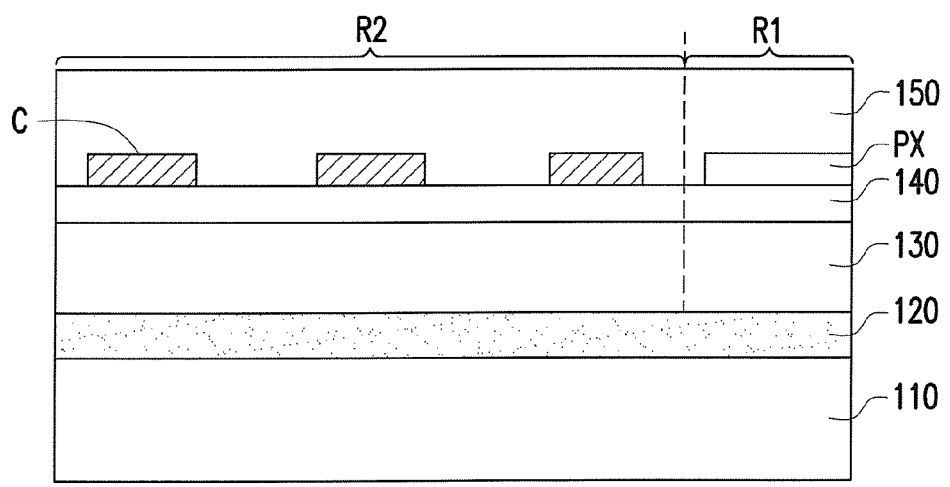

Then, as shown in FIG. 4E, the protective layer 150 is formed on the substrate 130 covering the peripheral circuit S and the pixel array. The protective layer may be organic materials or inorganic materials, but the invention is not limited thereto.

Figure 4F:
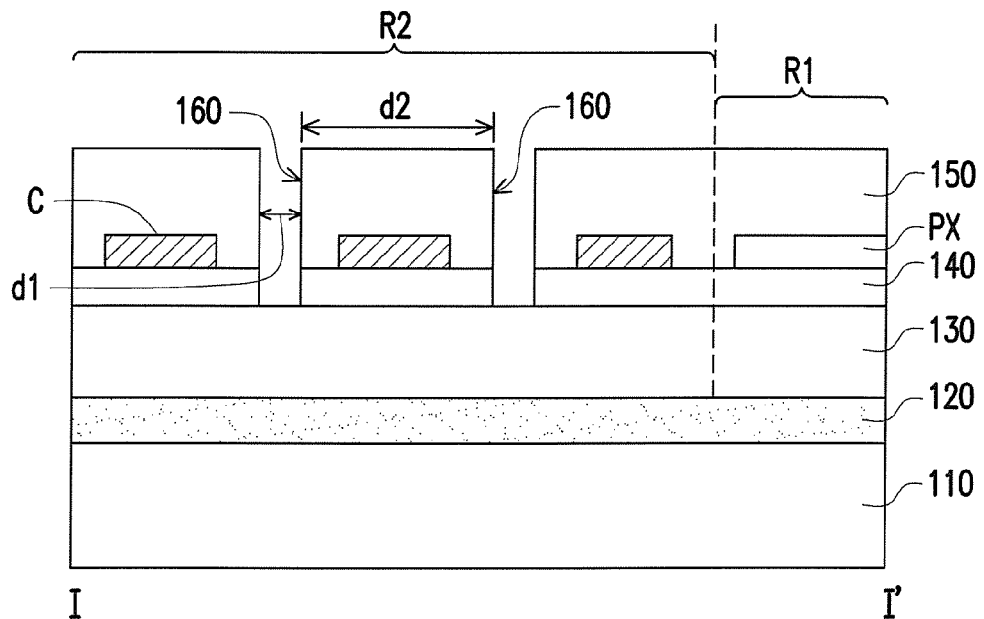

Next, as shown in FIG. 4F, the plurality of openings 160 are formed in the protective layer 150 and the buffer layer 140 in the non-display region R2, wherein the substrate 130 is exposed by the openings 160. Specifically, the openings 160 may also be formed in the protective layer 150 and the buffer layer 140 in the driving chip region R1. It should be noted that, the openings 160 do not overlap with the conductive device C in the non-display region R2, and the openings 160 do not pass through the substrate 130 but end at the substrate 130 instead. The aperture d1 of the openings 160 is, for example, between 1 μm and 1 mm, and the spacing d2 of the openings 160 is, for example, between 10 μm and 1 cm, but the invention is not limited thereto. Depending on properties of the film on the substrate 130, the aperture d1 and the spacing d2 of the openings 160 in the non-display region R2 may be adjusted. For example, when the film on the substrate 130 has the shrinking stress, due to the fact that the gas is not easy to laterally diffuse within the substrate 130, it is necessary that the aperture d1 of the openings 160 be increased or the spacing d2 of the openings 160 be reduced, in order to enhance an amount of the gas which passes through the openings 160 and reaches the sealing material layer 120 under the substrate 130. On the contrary, when the film on the substrate 130 has the tensile stress, the aperture d1 of the openings 160 may be reduced or the spacing d2 of the openings 160 may be increased. That is, the distribution density of the openings 160 in the non-display region R2 may be reduced, so that the design and the fabrication processes of the display panel 100 may become more easily. Furthermore, the openings 160 may be evenly or unevenly distributed. The distribution form of the openings 160 may be adjusted according to the need of the fabrication processes, as long as the openings 160 do not overlap with the metal devices C in the non-display region R2.

Figure 4G:
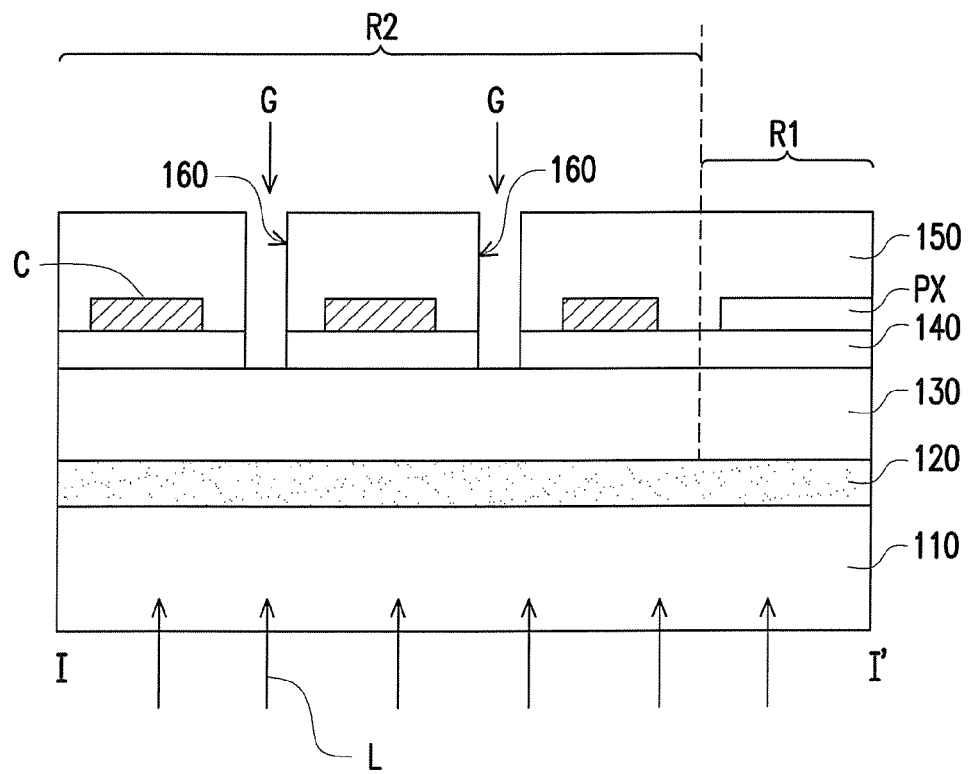

Next, as shown in FIG. 4G, a gas G is introduced under the environment of which the temperature is between 5° C. and 80° C. and the pressure is at 1 atmosphere. Then, treatment procedures are performed to the sealing material layer 120. The treatment period is between 1 second and 10 minutes so as to reduce the adhesion between the sealing material layer 120 and the substrate 130. The gas G is introduced to the substrate 130 through the openings 160 and diffuses to the sealing material layer 120. The gas G includes air or oxygen gas. The above treatment procedures to the sealing material layer 120 include an irradiation procedure or a heating procedure. For example, a light L may be irradiated to the sealing material layer 120 from the backside of the supporting substrate 110, so as to weaken the adhesion between the sealing material layer 120 and the substrate 130, and between the sealing material layer 120 and the supporting substrate 110, respectively. Since the overall supporting substrate 110 is translucent, the sealing material layer 120 may receive the light L fully and evenly, so that the sealing material layer 120 may be photo-dissociated evenly. Herein, the light L irradiated to the sealing material layer 120 is, for example, the UV light which has a power such as between 5 mW/cm$^2$ to 300 mW/cm$^2$. The sealing material layer 120 may be irradiated with the light of different bands and different power according to different photosensitive properties of the selected sealing material layer 120.

Figure 4H:
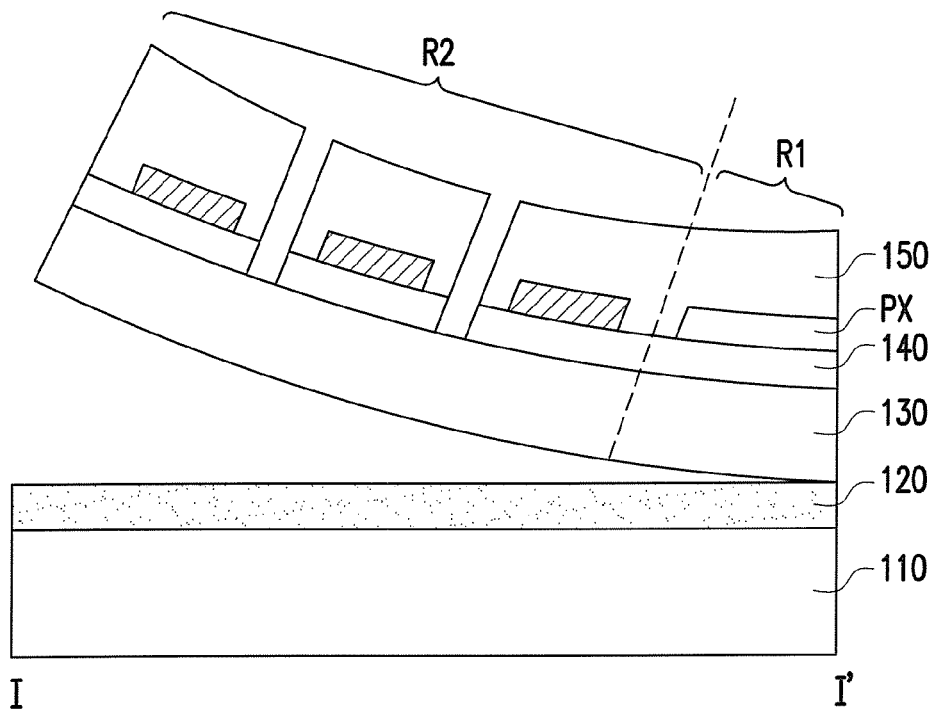
Figure 4I:
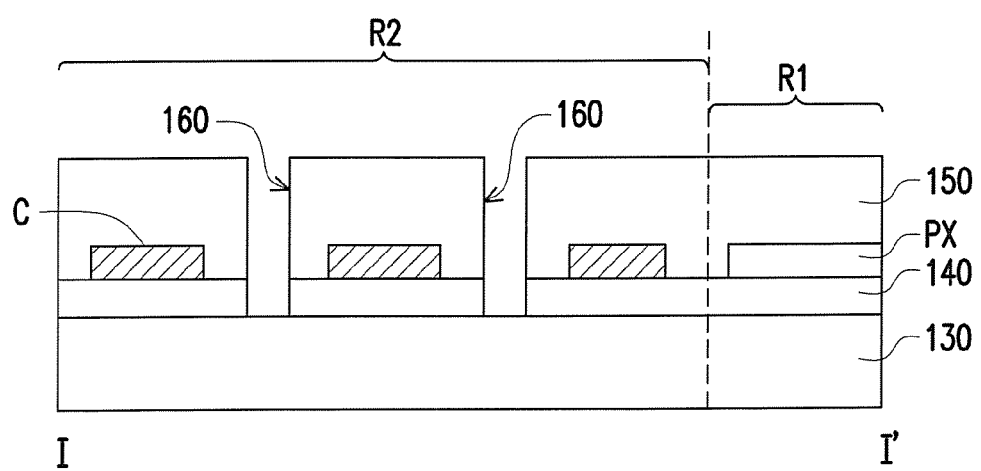

After that, refer to FIG. 4H, the substrate 130 and the sealing material layer 120 are separated and the substrate 130 is removed from the supporting substrate 110. It is worth mentioning that, in the present embodiment, through the above treatments performed to the sealing material layer 120, a degree of weakening of the adhesion surface between the sealing material layer 120 and the substrate 130 is greater than a degree of weakening of the adhesion surface between the sealing material layer 120 and the supporting substrate 110. Accordingly, the substrate 130 may be separated from the sealing material layer 120 so as to keep the sealing material layer 120 on the supporting substrate 110. The advantage mentioned above is that the display panel 100 according to an embodiment of the invention may be fabricated (as shown in FIG. 4I) without the need of a step of further removing the sealing material layer 120 form the substrate 130. In other embodiments, the sealing material layer 120 may also be remained on the substrate 130, wherein the sealing material layer 120 and the substrate 130 are removed together from the supporting substrate 110 (not shown). The sealing material layer 120 remained on the substrate 130 may enhance the water-blocking ability and the oxygen-blocking ability of the removed display panel 100. For the conventional display panel without the openings 160, the release force needed to peel and separate the substrate 130 from the supporting substrate 110 is about 14 gf/25 mm, wherein in a case that the chip is already bonded to the substrate 130 before the peeling and separating, the release force may even reach 1000 gf/25 mm. However, in the present embodiment, in a case that the chip is already bonded to the substrate 130 before the peeling and separating, the release force needed to peel and separate the substrate 130 form the supporting substrate 110 may be greatly reduced to, for example, less than or equal to 1 gf/mm.

The release force actually required may vary with the materials of the sealing material layer 120 and the supporting substrate 110. Furthermore, the release force may be different according to the irradiation treatment or the heating treatment performed to the sealing material layer 120.

It is noted that, in the invention, the time when the chip IC is set in the driving chip region R is not limited to the time after separating the substrate 130 and the sealing material layer 120. Instead, the chip IC may be set in the driving chip region R after forming the openings 160 (which is the step in FIG. 4F), and then, the step of introducing the gas G and performing the treatment procedures to the sealing material layer 120 (which is the step in FIG. 4G) is performed.

According to the above, in the display panel of the invention, the protective layer of the non-display region has the plurality of openings, which may greatly reduce the release force produced upon removing the flexible substrate, and thus the success rate of removing the flexible substrate may be enhanced. Accordingly, product yield of the display panel may be further improved.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided which fall within the scope of the following claims and their equivalents.

What is claimed is:

1. A fabrication method of a display panel, comprising:
   forming a sealing material layer and a substrate sequentially on a supporting substrate, wherein the substrate has a display region and a non-display region;
   forming a pixel array in the display region of the substrate and forming a peripheral circuit in the non-display region of the substrate, wherein the peripheral circuit and the pixel array are electrically connected;
   forming a protective layer on the substrate to cover the peripheral circuit and the pixel array;
   forming a plurality of openings in the protective layer in the non-display region so as to expose the substrate;
   introducing a gas and performing a treatment procedure to the sealing material layer, to reduce adhesion between the sealing material layer and the substrate, wherein the gas is introduced into the substrate through the openings and diffuses to the sealing material layer; and
   separating the substrate and the sealing material layer.

2. The fabrication method of the display panel as claimed in claim 1, wherein the aperture of the openings is between 1 μm and 1 mm, and the spacing between the openings is between 10 μm and 1 cm.

3. The fabrication method of the display panel as claimed in claim 1, wherein the non-display region further comprises a driving chip region, and the openings are formed in the protective layer in the driving chip region.

4. The fabrication method of the display panel as claimed in claim 3, wherein after forming the openings, further comprises setting a chip in the driving chip region.

5. The fabrication method of the display panel as claimed in claim 3, wherein after introducing the gas and performing the treatment procedure to the sealing material layer, further comprises setting a chip in the driving chip region.

6. The fabrication method of the display panel as claimed in claim 1, wherein the introduced gas comprises oxygen gas, and the treatment procedure performed to the sealing material comprises an irradiation procedure or a heating procedure.

* * * * *